United States Patent
Mann et al.

(10) Patent No.: US 7,085,075 B2
(45) Date of Patent: Aug. 1, 2006

(54) PROJECTION OBJECTIVES INCLUDING A PLURALITY OF MIRRORS WITH LENSES AHEAD OF MIRROR M3

(75) Inventors: Hans-Juergen Mann, Oberkochen (DE); Russell Hudyma, San Ramon, CA (US); Alexander Epple, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/639,780

(22) Filed: Aug. 12, 2003

(65) Prior Publication Data

US 2005/0036213 A1    Feb. 17, 2005

(51) Int. Cl.
G02B 17/00   (2006.01)

(52) U.S. Cl. .................. 359/726; 359/727; 359/739

(58) Field of Classification Search ........ 359/656–661, 359/726–732, 739
See application file for complete search history.

(56) References Cited

U.S. PATENT DOCUMENTS

| | | | |
|---|---|---|---|
| 4,346,164 A | 8/1982 | Tabarelli et al. | 430/311 |
| 4,469,414 A | 9/1984 | Shafer | 359/365 |
| 4,509,852 A | 4/1985 | Tabarelli et al. | 355/30 |
| 4,685,777 A | 8/1987 | Hirose | 359/366 |
| 4,695,464 A | 9/1987 | Alderman | 424/449 |
| 5,052,763 A | 10/1991 | Singh et al. | 359/355 |
| 5,323,263 A | 6/1994 | Schoenmakers | 359/366 |
| 5,515,207 A | 5/1996 | Foo | 359/731 |
| 5,537,260 A | 7/1996 | Williamson | 359/723 |
| 5,592,329 A | 1/1997 | Ishiyama et al. | 359/399 |
| 5,742,436 A | 4/1998 | Furter | 359/727 |
| 5,805,357 A | 9/1998 | Omura | 359/727 |
| 5,808,805 A | 9/1998 | Takahashi | 359/651 |
| 5,815,310 A | 9/1998 | Williamson | 359/365 |
| 5,835,275 A | 11/1998 | Takahashi et al. | 359/629 |
| 6,169,627 B1 | 1/2001 | Schuster | 359/364 |
| 6,195,213 B1 | 2/2001 | Omura et al. | 359/927 |
| 6,353,470 B1 * | 3/2002 | Dinger | 355/71 |
| 6,362,926 B1 | 3/2002 | Omura et al. | 359/727 |
| 6,683,729 B1 * | 1/2004 | Schuster | 359/656 |
| 2002/0012100 A1 | 1/2002 | Shafer | 353/30 |
| 2002/0024741 A1 | 2/2002 | Terasawa et al. | 359/627 |
| 2003/0011894 A1 | 1/2003 | Schuster | 359/731 |
| 2004/0075894 A1 * | 4/2004 | Shafer et al. | 359/365 |

FOREIGN PATENT DOCUMENTS

DE   100 02 626   7/2001

(Continued)

*Primary Examiner*—Jordan M. Schwartz
*Assistant Examiner*—Jessica Stultz
(74) *Attorney, Agent, or Firm*—Darby & Darby

(57) ABSTRACT

According to one exemplary embodiment, a projection objective is provided and includes at least two non-planar (curved) mirrors, wherein an axial distance between a next to last non-planar mirror and a last non-planar mirror, as defined along a light path, is greater than an axial distance between the last non-planar mirror and a first refracting surface of lenses following in the light path. In one exemplary embodiment, the first refracting surface is associated with a single pass type lens. The present objectives form images with numerical apertures of at least about 0.80 or higher, e.g., 0.95. Preferably, the objective does not include folding mirrors and there is no intermediate image between the two mirrors, as well as the pupil of the objective being free of obscuration.

52 Claims, 2 Drawing Sheets

FOREIGN PATENT DOCUMENTS

| | | |
|---|---|---|
| EP | 0023231 | 2/1981 |
| EP | 1 168 028 A2 | 1/2002 |
| JP | 10303114 | 11/1998 |
| JP | 2003114387 | 4/2003 |
| WO | WO-01/51979 | 7/2001 |
| WO | WO 01/51979 A2 | 7/2001 |
| WO | WO 02/44786 A2 | 6/2002 |
| WO | WO 2004/107011 A1 | 12/2004 |

* cited by examiner

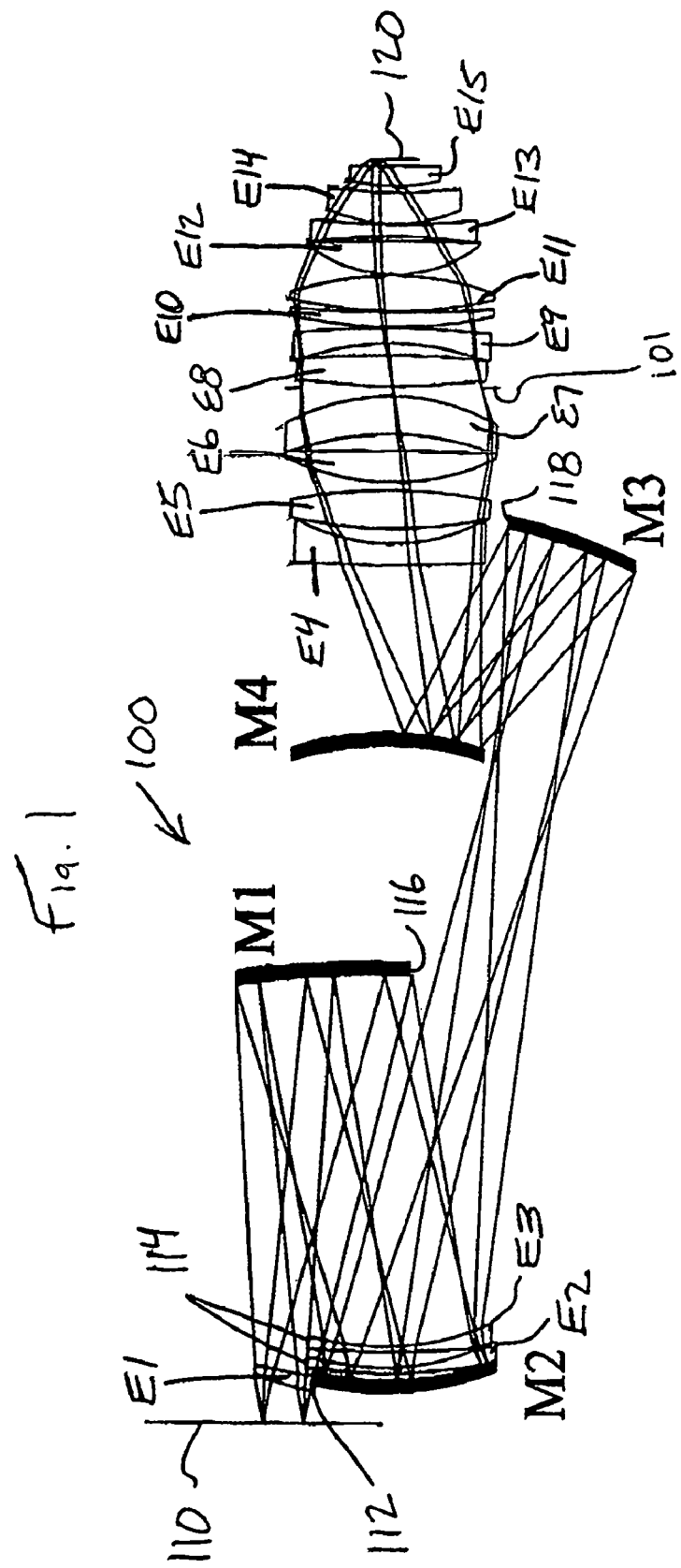

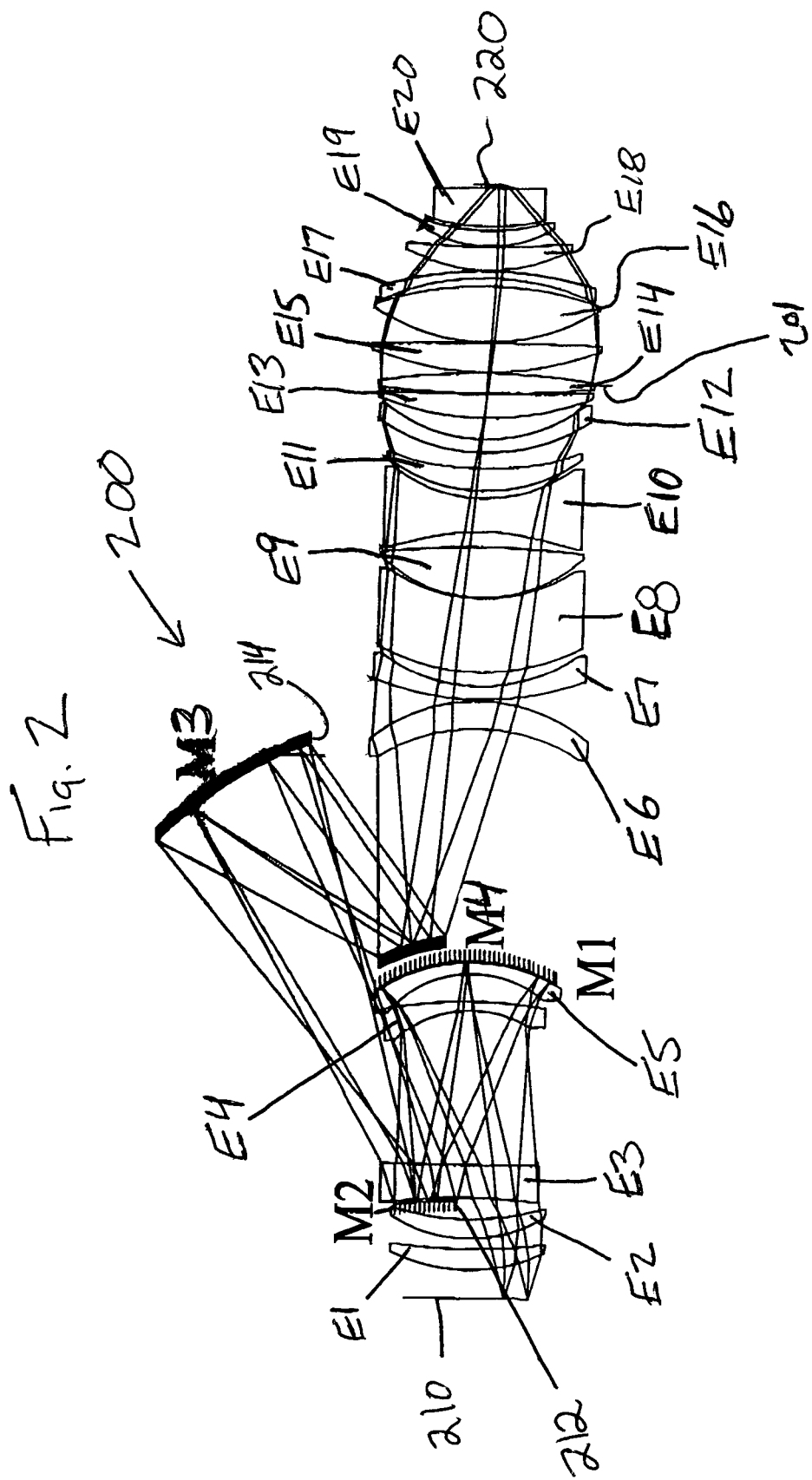

PROJECTION OBJECTIVES INCLUDING A PLURALITY OF MIRRORS WITH LENSES AHEAD OF MIRROR M3

TECHNICAL FIELD

The present invention relates to an optical system, such as projection lithography and more particularly, relates to an optical system with at least two mirrors, preferably at least 4 mirrors, with at least one lens element spatially ahead of mirror M3.

BACKGROUND

In the manufacture of semiconductor devices, photolithography is often used, especially in view of the circuit patterns of semiconductors being increasingly miniaturized in recent years. Projection optics are used to image a mask or reticle onto a wafer and as circuit patterns have become increasingly smaller, there is an increased demand for higher resolving power in exposure apparatuses that print these patterns. To satisfy this demand, the wavelength of the light source must be made shorter and the NA (numerical aperture) of the optical system (i.e., the projection lens) must be made larger.

Optical systems having a refractive group have achieved satisfactory resolutions operating with illumination sources having wavelengths of 248 or 193 nanometers. At these wavelengths, no or only slight correction of chromatic aberration is needed. As the element or feature size of semiconductor devices becomes smaller, the need for optical projection systems capable of providing enhanced resolution increases. In order to decrease the feature size which the optical projection systems used in photolithography can resolve, shorter wavelengths of electromagnetic radiation must be used to project the image of a reticle or mask onto a photosensitive substrate, such as a semiconductor wafer.

Because very few refractive optical materials are able to transmit significant electromagnetic radiation below a wavelength of 193 nanometers, it is necessary to reduce to a minimum or eliminate refractive elements in optical projection systems operating at wavelengths below 193 nanometers. To date, no second optical material is known which allows for chromatic aberration correction at wavelengths below 160 nm or shorter with sufficient material properties (homogeneity property, availability). Consequently, one has to construct a catadioptric imaging system, such as the present one, in order to allow for correction of chromatic aberrations with the use of only one single material, especially, $SiO_2$ or $CaF_2$.

The desire to resolve ever smaller features makes necessary optical projection systems that operate at the extreme ultraviolet wavelengths, below 200 nm; and therefore, as optical lithography extends into shorter wavelengths (e.g., deep ultraviolet (DUV) or very ultraviolet (VUV)), the requirements of the projection system become more difficult to satisfy. For example, at a wavelength of 157 nm, access to 65 nm design rules requires a projection system with a numerical aperture of at least 0.80. As optical lithography is extended to 157 nm, issues relating to resist, sources and more importantly calcium fluoride have caused substantial delays to the development of lithography tools that can perform satisfactorily at such wavelengths. In response to the technical issues relating to the source and the material, it is important that projection system development investigates and focuses on maximizing spectral bandwidth to an order of 1 pm, while simultaneously minimizing the deficiencies associated with the materials that are used, i.e., it is desirable to minimize the calcium fluoride blank mass.

It has long been realized that catadioptric reduction optical systems (i.e., ones that combine a reflective system with a refractive system) have several advantages, especially in a step and scan configuration, and that catadioptric systems are particularly well-suited to satisfy the aforementioned objectives. A number of parties have developed or proposed development of systems for wavelengths below 365 nm. One catadioptric system concept relates to a Dyson-type arrangement used in conjunction with a beam splitter to provide ray clearance and unfold the path to provide for parallel scanning (e.g., U.S. Pat. Nos. 5,537,260; 5,742,436; and 5,805,357). However, these systems have a serious drawback since the size of the beam-splitting element becomes quite large as the numerical aperture is increased, thereby making the procurement of optical material with sufficient quality (in three dimensions) to make the cube beam splitter a high risk endeavor, especially at a wavelength of 157 nm.

The difficulties associated with the cube beam splitter size are better managed by locating the cube beam splitter in the short conjugate of the system, preferably near the reticle or at its 1× conjugate if the design permits. Without too much effort, this beam splitter location shrinks the linear dimension of the cube by up to 50%, depending upon several factors. The advantages of this type of beam splitter placement are described in U.S. Pat. No. 5,052,763 to Wilczynski. Further, U.S. Pat. No. 5,808,805 to Takahashi provides some different embodiments; however, the basic concept is the same as in Wilczynski.

It is also possible to remove the cube beam splitter entirely from the catadioptric system. In one approach, an off-axis design is provided using a group with a numerical aperture of 0.70 operating at 248 nm. In U.S. Pat. Nos. 6,195,213 and 6,362,926 to Omura et al. disclose other examples of this approach and U.S. Pat. No. 5,835,275 to Takahashi illustrates yet another example. Takahashi et al. offer several similar examples of beam splitter free designs in European patent application EP 1168028.

Most of these "cubeless" embodiments share a common theme, namely that the catadioptric group contains only a single mirror. Additional mirrors can possible be used to improve performance. However, pure reflective designs with multiple mirrors have been investigated but have largely failed because these designs have proven unable to achieve adequately high numerical apertures (e.g., U.S. Pat. Nos. 4,685,777; 5,323,263; 5,515,207; and 5,815,310).

Another proposed solution is disclosed in U.S. Pat. No. 4,469,414 in which a restrictive off-axis field optical system is disclosed. The system disclosed in this reference does not include a doubly passed negative lens in a first partial objective. Further, the embodiments disclosed therein are of impractical geometry and of far too low numerical aperture to provide improved lithography performance in the ultraviolet wavelength region.

In conventional practice, four mirror catadioptric configurations typically are limited in terms of their numerical apertures due to the location of the refractive lens part relative to the mirrors of the system.

U.S. patent application publication No. 2002/0024741 discloses various projection optical systems including one in which a lens element is positioned spatially in front of mirror M3; however, in this embodiment, the lens element that is positioned in front of mirror M3 is a double pass type lens element. The use of a double pass lens element complicates the system design because the use of a double pass lens between mirrors M3 and M4 requires the double pass lens to be close to mirror M4 and therefore it is difficult to mount.

In addition, there are a number of other differences between the system disclosed in this published application and the present system. For example, FIG. 26 of the 2002/0024741 publication discloses a single pass lens element optically disposed between the very first mirror and the very last mirror of the whole system. Unfortunately, this element is very large in diameter and therefore difficult to manufacture. The disadvantage of such a single pass lens element is that it either requires a lateral separation of beam bundles traveling between the various mirrors, resulting in a large diameter of the lens or that it has to be physically disposed between the backside of mirror #1 and the backside of mirror #4 as shown in each of the FIGS. 23 to 28, again leading to a large diameter of the lens. As will be described in greater detail hereinafter, the present embodiments do not suffer from this disadvantage since the present lens elements are not required to be very large in diameter. With respect to the location of the aperture stop, the embodiments in the publication (as shown in FIGS. 20–28) have an aperture stop located in front of the refractive group Gr2 with the aperture stop separating it from the field mirror group Grf.

U.S. Pat. No. 5,323,263 to Schoenmakers discloses an embodiment in which there are multiple mirrors used in which a number of lens elements are disposed between the most optically forward mirror and the second most optically forward mirror. The lens elements between these two mirrors are all single mirrors.

What has heretofore not been available is a catadioptric projection system, especially a four mirror design, that has particular utility in 157 nm lithography and produces an image with a numerical aperture of at least 0.80 and includes other desirable performance characteristics.

SUMMARY

Various photolithographic reduction projection objectives according to a number of embodiments are provided herein. An exemplary projection objective includes at least two non-planar mirrors, wherein an axial distance between a next to last non-planar mirror and a last non-planar mirror, as defined along a light path (optical axis), is greater than an axial distance between the last non-planar mirror and a first refracting surface of lenses following in the light path. In one embodiment, the first refracting surface is associated with a single pass type lens. The present objectives form images with numerical aperture of at least about 0.80 or higher, e.g., 0.95.

In one aspect of the present invention, each of the present objectives consists of two parts, namely a catadioptric and a refractive part. According to the present designs, each of the refractive lens parts is advanced towards the front and thus begins already in front of the third mirror M3. This is in contrast to conventional designs that include at least four mirrors and by moving the refractive part forward, high numerical aperture is achieved in a four mirror configuration. Moreover, the present system is configured so that a pupil thereof is free of obscuration, thereby resulting in an improved image.

An exemplary objective includes one more of the following features: (1) at least one of four aspherical lens surfaces and four aspherical mirror surfaces; (2) at least four non-planar mirrors; and (3) includes at least one light-dispersing mirror and at least two light-collecting mirrors. In addition, the objective does not have folding mirrors and also does not have an intermediate image between the two mirrors and in at least one embodiment, there is only one lens element (single pass type) between the next to last and last mirrors.

Other features and advantages of the present invention will be apparent from the following detailed description when read in conjunction with the accompanying drawings.

BRIEF DESCRIPTION OF THE DRAWING FIGURES.

The foregoing and other features of the present invention will be more readily apparent from the following detailed description and drawings figures of illustrative embodiments of the invention in which:

FIG. 1 schematically illustrates a microlithographic projection reduction objective according to a first embodiment; and FIG. 2 schematically illustrates a microlithographic projection reduction objective according to a second embodiment.

DETAILED DESCRIPTION OF PREFERRED EMBODIMENTS

In order to provide the above advantages and to solve problems discussed above with respect to the related art systems, catadioptric projection systems according to a number of different embodiments are provided. The present systems achieve numerical apertures up to and in excess of 0.80 while overcoming the disadvantages associated with the prior art.

Referring first to FIG. 1, a catadioptric multi-mirror projection reduction objective 100 according to a first embodiment is illustrated. FIG. 1 is a schematic optical diagram of the system 100 illustrating the system 100 in an manner to generally show the arrangement of the elements. The system 100 includes a plurality of mirrors and a plurality of lens elements that are arranged in distinct groups and in predetermined locations relative to the mirrors.

For purpose of the present application, the term "optically in front of" refers to a situation where light rays impinge upon a first element prior to a second element, thus making the first element optically in front of the second element. The term "optically behind" refers to the converse situation and therefore, in the above example, the second element is optically behind the first element since the light rays first encounter the first element. The terms "physically in front of" or "spatially in front of" and "physically behind" or "spatially behind" define spatial relationships between the surface vertexes of two elements irrespective of the path of the light rays and only with reference to a point of reference.

In the illustrated embodiment, the system 100 includes a reticle (object) 110 and contains more positive lens elements than negative lens elements and more specifically and as detailed below, one exemplary system 100 includes 15 lens elements with 10 being positive lens elements and 5 being negative lens elements.

The system 100 includes the reticle 110 and a wafer 120 on which a reduced image is formed based on the reticle 110 as is commonly known. Beginning from the least image forward element and ending with the most image forward element along the optical path of the system 100, the system 100 includes a first lens element E1 that is disposed between the reticle 110 and a mirror M2. The first lens element E1 is a positive lens through which the light rays pass from one or more points of the reticle 110 toward the mirror M2. The mirror M2 is preferably a curved mirror (e.g., spherical or aspherical mirror) and in the illustrated embodiment, the mirror M2 does not include a continuous reflective surface but rather the mirror M2 has one or more regions where an opening 112 or the like is formed to permit free passage of light rays therethrough without being influenced at all by the mirror M2. The one or more openings 112 are formed in the mirror M2 at locations at are optically aligned with locations where the light rays pass through the first lens element E1. Alternatively, it will be appreciated that the mirror M2 can be constructed and arranged as an off axis mirror so that the mirror M2 is positioned off axis at locations that permit the light rays to pass by the mirror M2.

Optically and physically behind the mirror M2 is a pair of second and third lens elements E2 and E3, respectively. Each of the lens elements E2 and E3 is a negative lens and because of the arrangement between mirror M2 and mirror M1 and the physical construction of the lens elements E2 and E3, the lens elements E2 and E3 act as double pass lenses. More specifically, the lens elements E2 and E3 are disposed between mirror M2 and mirror M1 and similar to the mirror M2, the lens elements E2 and E3 do not have an entirely continues surface but rather one or more openings 114 are formed in each lens element to permit light rays to freely pass therethrough without being influenced by the lens elements. The one or more openings 114 are optically aligned with the one or more openings 112 formed in the mirror M2 so that the light rays that pass through the openings or cut outs 112 in the mirror M2 before then passing through the opening or cut outs 114 in the lens elements E2 and E3 before contacting the reflective surface of mirror M1. Once again and instead of having a physical opening formed therein, the lens elements E2 and E3 can be constructed so that they are formed and arranged so that the light rays passing by the mirror M2 also pass by and not through the lens elements E2 and E3. The mirror M1 is preferably a curved mirror (e.g., spherical or aspherical mirror). One will appreciate that the mirrors M1 and M2 are both light collecting mirrors.

It will be appreciated that mirror M1 is the first mirror in the optical path since the light rays initially pass through openings 112 formed in mirror M2 and only later strike the reflective surface of mirror M2 after having contacted and been reflected by the surface of mirror M1. After being reflected by the mirror M1, the light rays are directed toward the mirror M2 and first pass through lens element E2 and E3 before striking the reflective surface of mirror M2. As previously mentioned, the lens elements E2 and E3 are double pass types lenses since the light rays travel first through the lens elements as they travel from mirror M1 to mirror M2 and then pass through the lens elements a second time as the light rays are reflected by mirror M2 toward a mirror M3 which is preferably a curved mirror (e.g., spherical or aspherical mirror). Mirror M3 is a light collecting mirror.

Mirror M1 is also constructed so that it includes one or more openings or cut outs 116 to permit passage of the light rays from mirror M2 to a reflective surface of mirror M3. As will be appreciated by the illustration of FIG. 1, the mirror M1 has one or more active regions that reflect light rays as well as containing the one or more openings or cut outs 116 to permit the lights rays to travel along the optical path of the system 100, e.g., from mirror M2 to mirror M3, which are both optically behind mirror M1. Again, mirror M1 can be constructed as an off axis mirror that permits the light rays to pass thereby from the mirror M2 to the mirror M3.

A mirror M4 is positioned physically in front of but optically behind the mirror M3 such that a reflective surface of mirror M3 faces a reflective surface of mirror M4. Mirror M4 is preferably a curved mirror (e.g., spherical or aspherical mirror). As will be described in greater detail hereinafter, mirror M3 includes an opening or cut out 118 formed therein to accommodate a lens element. Mirror M4 is a light dispersing mirror. Mirror M3 can similarly be formed as an off axis mirror that is constructed and designed to permit the light rays to pass thereby after the light rays are reflected by the mirror M4.

According to one aspect of the present invention, a lens element, namely a fourth lens element E4, is disposed between the mirror M3 and mirror M4 such that the lens element E4 is physically in front of mirror M3 but optically behind both mirrors M3 and M4. The lens element E4 is a negative lens that is positioned proximate the mirror M3 and as will be appreciated by viewing FIG. 1, the lens element E4 acts as a single pass lens element in that the light rays only pass through the lens element E4 once as they travel according to the optical path of the system 100. This is a difference between other lens designs where a lens element that may be placed between mirror M3 and M4 is positioned close to mirror M4 such that the lens element acts as a double pass lens element since the light rays pass once therethrough to the reflective surface of M4 before then passing through the lens element a second time as the light rays travel in a direction toward M3.

The system 100 includes a fifth lens element E5 that is disposed within the opening or cut out 118 formed in the mirror M3. The lens elements E4 and E5 are disposed along the optical axis so that light rays that are reflected from mirror M4 pass through the lens element E4 and then through lens element E5 which is contained within the mirror M3. In other words, the mirrors M3 and M4 are both optically in front of the lens elements E4 and E5. In the illustrated embodiment, the lens element E5 is a positive lens element that at least partially extends beyond one face of the mirror M3 as well as an opposite face of the mirror M3.

The system 100 is designed so that there are a group of lens elements that are both physically and optically behind the mirror M3 and the lens elements E4 and E5. According to one exemplary embodiment, there are ten lens elements that are disposed optically behind the lens element E5 and more specifically, lens elements E6 to E15 are disposed along the optical axis and optically behind the lens element E5 and optically and physically in front of the wafer 120. Lens elements E6–E8 are positive lenses, lens element E9 is a negative lens, lens elements E10–E12 are positive lenses, lens element E13 is a negative lens; and lens elements E14 and E15 are positive lenses.

As will be appreciated with reference to FIG. 1, an intermediate image is produced in the light path at the axial location of M4. In order to ensure that no vignetting occurs, the light path has to be routed so that it completely by-passes mirror M4 and it has to be ensured that the light rays do not fall into the central opening (bore) 118 of mirror M3. This requires large deflection angles and thus large refractive powers in the mirrors M3 and M4 as well as high incidence angles, especially on mirror M4.

The large ray angles after M4 have the effect that the main rays converge rapidly towards the optical axis. Thus, the diaphragm position is pulled closer to mirror M4. However, in order to be able to effectively correct chromatic variation of the magnification, it is necessary to use refractive power in front of the aperture diaphragm. This is possible only by pulling the lenses of the refractive portion spatially (physically) ahead of M3.

This (the need for pulling the lenses of the refractive portion spatially ahead) is considered a direct consequence of the high aperture of this design arrangement. In other words, the arrangement of the lens elements and mirrors as illustrated in FIG. 1 permit it possible to achieve high numerical aperture values in designs of this kind. For example, the system 100 has a numerical aperture of at least about 0.80.

In addition, the present system 100 has a conjugate aperture stop between mirrors M1 and M2, while the aperture stop is located in a back part of the lens arrangement which acts as the refractive part. More specifically, the aperture stop is indicated by marker 101 in FIG. 1 (which is a position immediately spatially and optically in front of lens element E8).

One of the advantages of the present system 100 is that there is no obscuration of the pupil. In other words, there is no central obscuration in the present system and therefore, all of the disadvantages associated with having a central obscuration are eliminated in the present design. As a result of the present lens system being free of a central obscuration of the pupil, the performance of the system is not jeopardized and the quality of the image is similarly not jeopardized or reduced since the presence of a central obscuration will prevent all of the light rays from passing through to form the image.

A complete optical description is found in Table 1, describing the optical surfaces of the system 100.

Now referring to FIG. 2 in which a catadioptric multimirror projection reduction objective 200 according to a second embodiment is illustrated. FIG. 2 is a schematic optical diagram of the system 200 illustrating the system 200 in an manner to generally show the arrangement of the elements. The system 200 includes a plurality of mirrors and a plurality of lens elements that are arranged in distinct groups and in predetermined locations relative to the mirrors.

In the illustrated embodiment, the system 200 includes a reticle 210 and contains more positive lens elements than negative lens elements and more specifically and as detailed below, one exemplary system 200 includes 20 lens elements with 13 being positive lens elements and 7 being negative lens elements.

The system 200 includes the reticle 210 and a wafer 220 on which a reduced image is formed based on the reticle 210 as is commonly known. Beginning from the least image forward element and ending with the most image forward element along the optical path of the system 200, the system 200 includes a first lens element E1 and a second lens element E2 that are disposed between the reticle 210 and a mirror M2. The first and second lens elements E1 and E2 are positive lenses through which the light rays pass from one or more points of the reticle 210 toward the mirror M2. The mirror M2 is preferably a curved mirror (e.g., spherical or aspherical mirror) and in the illustrated embodiment, the mirror M2 does not include a continuous reflective surface but rather the mirror M2 has one or more regions where an opening 212 or cut out or the like is formed to permit free passage of light rays therethrough without being influenced at all by the mirror M2. The one or more openings 212 are formed in the mirror M2 at locations that are optically aligned with locations where the light rays pass through the first and second lens elements E1 and E2 so that the light rays travel through the E1 and E2 and then through the mirror M2. As previously mentioned, mirror M2 does not necessarily have to have a physical opening formed therethrough but instead it can be constructed as an off axis mirror that is positioned so that the light rays travel thereby from lens elements E1 and E2 to lens element E3.

The system 200 includes a third lens element E3 that is disposed physically (spatially) and optically behind the mirror M2. The light rays traveling through openings 212 formed in the mirror M2 subsequently travel through the lens element E3. In the illustrated embodiment, the third lens element E3 is a negative lens and is characterized as a triple pass lens element since the lights rays pass through this lens element three distinct times as the light rays travel along the optical path of the system 200.

The system 200 includes fourth and fifth lens elements E4 and E5 that are spatially and optically behind the lens element E3. In the illustrated embodiment, the lens elements E4 and E5 are negative lenses. The lens elements E4 and E5 are disposed spatially proximate to the mirror M1 such that light rays that pass through the lens element E3 pass through the lens elements E4 and E5 before contacting the reflective surface of the mirror M1. It will be appreciated that the lens elements E4 and E5 are double pass type lens elements since the lights rays pass through this lens element two distinct times as the light rays travel along the optical path of the system 200. More specifically, after the light rays contact the mirror M1, the light rays pass back through the lens elements E4 and E5 as the rays travel toward the mirror M2. Before the light rays contact the mirror M2, the light rays pass through the lens element E3 for a second time and then after the light rays contact the mirror M2, the light rays are reflected back through the lens element E3 for a third time (resulting in E3 being a triple pass lens). Preferably, the openings 212 of mirror M2 are formed in one region while the mirror M2 has another region that acts as a reflective mirror surface for reflecting the light rays from mirror M1. Mirror M1 is a light collecting mirror, while mirror M2 is a light dispersing mirror. Alternatively, the mirror M2 can be an off axis mirror without a physical opening 212 formed therethrough.

After the light rays pass through the lens element E3 for a third time, the light rays are directed to a mirror M3. The mirror M3, like mirrors M1 and M2, is a curved mirror (e.g., spherical or aspherical mirror). In the illustrated embodiment, the mirror M3 is centered off of the optical axis so that it includes an off axis region, generally indicated at 220, that receives the light rays from the mirror M2 as shown in FIG. 2. In other words, the mirror M3 is coaxially aligned but only used at an off-axis region.

The system 200 includes a mirror M4 that is spatially in front of but optically behind the mirror M3. As shown, the mirrors M1 and M4 are positioned back-to-back relative to one another with no lens elements being disposed therebetween. Mirror M3 is a light collecting mirror, while mirror M4 is a light dispersing mirror.

According to one aspect of the present invention and similar to the above described first embodiment, a lens element, namely a sixth lens element E6, is disposed between the mirror M3 and mirror M4 such that the lens element E6 is physically in front of mirror M3 but optically behind both mirrors M3 and M4. The lens element E6 is a positive lens that is positioned proximate the mirror M3 and as will be appreciated by viewing FIG. 2, the lens element E6 acts as a single pass lens element in that the light rays only pass through the lens element E6 once as they travel according to the optical path of the system 200 in contrast to other lens designs (e.g., see U.S. Patent Application publication No. 2002/0024741) in which the lens element acts as a double pass lens element.

The lens element E6 is positioned next to the mirror M3 in a region where the mirror M3 has one or more openings or cut outs 214 formed therethrough to permit the light rays that travel through the lens element E6 to then subsequently pass through the one or more openings 214 as the light travels according to the light path of the system 200. In other words, the lens element E6 preferably extends at least partially through the opening 214. Again, mirror M3 can be an off axis mirror that is positioned to permit the light rays to travel along the optical path from mirror M4.

The system 200 is designed so that there are a group of lens elements that are both physically and optically behind the mirror M3 and the lens elements E6. According to one exemplary embodiment, there are fourteen lens elements that are disposed optically behind the lens element E6 and more specifically, lens elements E7 to E20 are disposed along the optical axis and optically behind the lens element E6 and optically and physically in front of the wafer 120. Lens element E7 is a negative lens, lens elements E8 and E9 are positive lenses, lens element E10 is a negative lens, lens element E11 is a positive lens, lens element E12 is a negative lens, lens elements E13–E16 are positive lenses, lens element E17 is a negative lens, lens elements E18–E20 are positive lenses.

In other words, the arrangement of the lens elements and mirrors as illustrated in FIG. 2 permit it possible to achieve high numerical aperture values in designs of this kind. For example, the system 200 has a numerical aperture of at least about 0.95. A conjugate aperture stop is located between the reticle 210 and the mirror M1, while the aperture stop is located in a back part of the lens arrangement which acts as a refractive part. More specifically, the aperture stop in system 200 is indicated by marker 201 in FIG. 2.

As with the system 100, the system 200 is advantageously free of obscuration of the pupil (e.g., central obscuration) and therefore, the quality of the image is not jeopardized.

A complete optical description is found in Table 2, describing the optical surfaces of the system 200.

While, the term "opening", "bore" and "cut out" has been used throughout the present specification, one will appreciate that the lenses can be constructed in a number of other different ways to accomplish the same objective which is to permit the free passage of lights rays therethrough. Thus, these terms are only exemplary and not limiting of the present design. In addition, the shape of the opening or cut out can be varied and is not limited to any particular shape or size so long as the openings and cut outs perform the intended function. In addition, the mirror and refractive lens elements can be constructed so that they do not include a physical opening formed therethrough but rather the mirror or lens element is constructed as an off axis element to permit the light rays to travel along the optical path without any interference by this element.

In one aspect of the present invention, each of the present objectives has a refractive lens part that is advanced towards the front and thus begins already in front of the third mirror M3. This is in contrast to conventional designs that include at least four mirrors and by moving the refractive part forward, high numerical aperture is achieved in a four mirror configuration.

Moreover, it is understood that the present systems disclosed herein are not limited to "dry systems" with numerical apertures less than 1.0 but rather the present designs can also be implemented in "immersion systems" with numerical apertures greater than or equal to 1.0. Thus, implementation of the present systems in immersion lithography is within the teachings of the present application.

While U.S. Pat. No. 5,323,263 discloses an arrangement in which there are multiple mirrors between the most optically forward mirror and the second most optically forward mirror; however, there are a number of differences between this system and the present embodiments. More specifically, in at least one of the present embodiments, there is only a single lens element of a single pass type that is disposed between mirror M3 and mirror M4. Moreover and in direct contrast to the arrangements in the '263 patent, the present embodiment does not include folding mirrors. Also, the present embodiments do not have an intermediate image between the two mirrors.

As previously mentioned, there are a number of differences between the present embodiments and those disclosed in U.S. patent application publication No. 2002/0024741. In the present embodiments, there is no single pass mirror between mirrors #1 and #4 and therefore, the present embodiments do not have the constraints of having to have a very large diameter lens element in contrast to the 2002/0024741 publication. This makes the present system easier to manufacture.

According to one exemplary embodiment, there is a limit of the maximum diameter of the lens elements with respect to the diameter of the aperture stop. For example, in the second embodiment disclosed herein, the maximum diameter of each lens element is less than 1.1 times the diameter of the aperture stop, whereas in the embodiments shown in FIGS. 23–28 of the 2002/0024741 publication, the quotient between the two diameters is at least 1.5, which means that there is again a huge lens element which leads to manufacturing problems. Even in the embodiments disclosed in FIGS. 20 and 22, the quotient is greater than 1.1.

Moreover, the location of the aperture stop in the present embodiments is different from the location in the 2002/0024741 publication and this leads to advantages. As shown in FIGS. 20–28 of the 2002/0024741 publication, the aperture stop is located in front of the refractive group Gr2 and separates it from the field mirror group Grf. In the present embodiments, the aperture stop is disposed in the rear part of the refractive group. This means that there is at least one lens element of the refractive group in front of the aperture stop. The advantage of such a position of the aperture stop is the fact that it allows for correction of the chromatic variation of magnification (also known as "later color").

The present embodiments thus include at least two curved (non-planar) mirrors as well as a plurality of optical elements that have a common axis of rotational symmetry. It will be appreciated that while rotational symmetry is a property of the mathematical surface of the optical element, Applicants are using this term to describe whether the optical element is on or off a common axis. Thus, the term describes whether the optical element is off-axis or not. The axial distance between two elements, such as a mirror and a lens element or two mirrors is defined as the distance between the vertices of the surfaces. In the present system, the off axis mirrors have only virtual vertices and therefore, when computing the axial distance between the off axis mirror and another element, this is taken into account. In addition, when an optical element is discussed as being physically between the first and second mirrors it refers to an optical element that is between the physically existing off-axis mirrors.

While exemplary drawings and specific embodiments of the present invention have been described and illustrated, it is to be understood that the scope of the present invention is not to be limited to the particular embodiments discussed.

Thus, the embodiments shall be regarded as illustrative rather than restrictive, and it should be understood that variations may be made in those embodiments by workers skilled in the art without departing from the scope of the present invention as set forth in the claims that follow, and equivalents thereof. In addition, the features of the different claims set forth below may be combined in various ways in further accordance with the present invention.

TABLE 1

| j890 FLAECHE | RADIEN | DICKEN | GLAESER | BRECHZAHL 157.63 nm | ½ FREIER DURCHMESSER | |
|---|---|---|---|---|---|---|
| 0 | 0.000000000 | 18.000000000 | | 1.00000000 | 72.500 | |
| 1 | 192.995627126AS | 12.518798156 | CAFL_VUV | 1.55928800 | 77.985 | |
| 2 | 291.389631363 | 274.544091677 | | 1.00000000 | 77.583 | |
| 3 | −649.856314294AS | −250.533863230 | | 1.00000000 | 92.471 | REFL |
| 4 | 146.689104606 | −3.750000000 | CAFL_VUV | 1.55928800 | 57.639 | |
| 5 | 540.274698809 | −11.201018265 | | 1.00000000 | 61.361 | |
| 6 | 134.962915715 | −3.750000000 | CAFL_VUV | 1.55928800 | 61.340 | |
| 7 | 300.894447330 | −5.309210182 | | 1.00000000 | 66.413 | |
| 8 | 173.972312558AS | 5.309210182 | | 1.00000000 | 66.174 | REFL |
| 9 | 300.894447330 | 3.750000000 | CAFL_VUV | 1.55928800 | 66.276 | |
| 10 | 134.962915715 | 11.201018265 | | 1.00000000 | 63.401 | |
| 11 | 540.274698809 | 3.750000000 | CAFL_VUV | 1.55928800 | 63.472 | |
| 12 | 146.689104606 | 558.441270617 | | 1.00000000 | 62.164 | |
| 13 | −317.532326155AS | −146.217379134 | | 1.00000000 | 152.413 | REFL |
| 14 | −193.169921455AS | 111.338004385 | | 1.00000000 | 57.345 | REFL |
| 15 | 544.351140924AS | 15.000000000 | CAFL_VUV | 1.55928800 | 56.680 | |
| 16 | 112.257898711 | 10.395792988 | | 1.00000000 | 56.810 | |
| 17 | 264.833194633 | 25.883573664 | CAFL_VUV | 1.55928800 | 57.316 | |
| 18 | −293.961910609 | 5.417147144 | | 1.00000000 | 59.447 | |
| 19 | 137.486688475 | 20.953421004 | CAFL_VUV | 1.55928800 | 62.932 | |
| 20 | −3025.153068070 | 11.399646108 | | 1.00000000 | 62.414 | |
| 21 | −167.500442889 | 25.171253731 | CAFL_VUV | 1.55928800 | 62.418 | |
| 22 | −124.000000000 | 5.678103829 | | 1.00000000 | 63.179 | |
| 23 | 0.000000000 | 0.500000000 | | 1.00000000 | 56.051 | |
| 24 | 271.494005321AS | 20.000000000 | CAFL_VUV | 1.55928800 | 56.205 | |
| 25 | −699.586280479 | 8.024560977 | | 1.00000000 | 56.555 | |
| 26 | −153.525285731 | 10.000000000 | CAFL_VUV | 1.55928800 | 56.558 | |
| 27 | −560.562638141 | 0.500000000 | | 1.00000000 | 58.953 | |
| 28 | 263.384921460 | 10.037592987 | CAFL_VUV | 1.55928800 | 60.575 | |
| 29 | 864.791835170 | 0.500000000 | | 1.00000000 | 60.626 | |
| 30 | 267.241902885 | 23.743236926 | CAFL_VUV | 1.55928800 | 60.923 | |
| 31 | −176.407844045 | 0.500000000 | | 1.00000000 | 60.632 | |
| 32 | 80.727620796 | 23.241259645 | CAFL_VUV | 1.55928800 | 51.404 | |
| 33 | −1567.809778070 | 3.038091826 | | 1.00000000 | 49.510 | |
| 34 | −334.276005123 | 8.000000000 | CAFL_VUV | 1.55928800 | 49.361 | |
| 35 | 363.397520174 | 0.500000000 | | 1.00000000 | 43.590 | |
| 36 | 91.645466319 | 21.030369305 | CAFL_VUV | 1.55928800 | 39.509 | |
| 37 | 196.136325952AS | 4.278863057 | | 1.00000000 | 31.382 | |
| 38 | 97.703490217 | 13.616164337 | CAFL_VUV | 1.55928800 | 26.772 | |
| 39 | 0.000000000 | 4.500000000 | | 1.00000000 | 20.752 | |
| 40 | 0.000000000 | 0.000000000 | | 1.00000000 | 14.501 | |

ASPHAERISCHE KONSTANTEN

| FLAECHE NR. | 1 |
|---|---|
| $\kappa$ | −0.9846 |
| C1 | 12.12694874e−008 |
| FLAECHE NR. | 3 |
| $\kappa$ | −1.7074 |
| C1 | −9.31272775e−009 |
| C2 | −1.05704221e−015 |
| C3 | 4.61520599e−018 |
| C4 | −5.33075354e−022 |
| C5 | 8.27260825e−026 |
| C6 | −8.30024327e−030 |
| C7 | 3.45094228e−034 |
| FLAECHE NR. | 8 |
| $\kappa$ | −0.0456 |
| C1 | 2.63538456e−009 |
| C2 | 1.11793425e−013 |
| C3 | 2.41790018e−017 |
| C4 | −1.0089515e−020 |
| C5 | 4.13326823e−024 |
| C6 | −7.77731881e−028 |
| C7 | 6.50000450e−032 |
| FLAECHE NR. | 13 |
| $\kappa$ | −0.7964 |
| C1 | −2.56213126e−009 |
| C2 | −5.13791281e−014 |
| C3 | 3.76578322e−018 |
| C4 | −2.50108813e−022 |

TABLE 1-continued

| j890 FLAECHE | RADIEN | DICKEN | GLAESER | BRECHZAHL 157.63 nm | ½ FREIER DURCHMESSER |
|---|---|---|---|---|---|
| C5 | 9.73773615e−027 | | | | |
| C6 | −2.13932370e−031 | | | | |
| C7 | 2.02307664e−036 | | | | |
| FLAECHE NR. | 14 | | | | |
| κ | 3.5141 | | | | |
| C1 | 1.58869838e−008 | | | | |
| C2 | 2.69356594e−012 | | | | |
| C3 | 4.93087232e−016 | | | | |
| C4 | −8.23724826e−020 | | | | |
| C5 | 4.07642063e−023 | | | | |
| C6 | −9.01540323e−027 | | | | |
| C7 | 1.00574364e−030 | | | | |
| FLAECHE NR. | 15 | | | | |
| κ | 0.0000 | | | | |
| C1 | −1.36546239e−007 | | | | |
| C2 | −2.70855990e−012 | | | | |
| C3 | −6.52020930e−016 | | | | |
| C4 | −1.19002872e−020 | | | | |
| C5 | −4.28776678e−023 | | | | |
| C6 | 2.94478404e−027 | | | | |
| FLAECHE NR. | 24 | | | | |
| κ | −25.4029 | | | | |
| C1 | −2.04498950e−008 | | | | |
| C2 | −3.73720369e−011 | | | | |
| C3 | 4.01117217e−015 | | | | |
| C4 | −1.12979269e−018 | | | | |
| C5 | 1.54644980e−022 | | | | |
| C6 | −1.63021485e−026 | | | | |
| FLAECHE NR. | 37 | | | | |
| κ | −19.2924 | | | | |
| C1 | 3.72477051e−007 | | | | |
| C2 | −1.71332431e−011 | | | | |
| C3 | −1.20561371e−014 | | | | |
| C4 | 2.13038172e−017 | | | | |
| C5 | −1.43316565e−020 | | | | |
| C6 | 4.63387907e−024 | | | | |

TABLE 2

| j900 FLAECHE | RADIEN | DICKEN | GLAESER | BRECHZAHL 157.63 nm | ½ FREIER DURCHMESSER | |
|---|---|---|---|---|---|---|
| 0 | 0.000000000 | 38.000000000 | | 1.00000000 | 73.000 | |
| 1 | 184.799217499 | 38.000000000 | CAFUV | 1.55412431 | 87.710 | |
| 2 | 574.400701842AS | 14.919168692 | | 1.00000000 | 87.093 | |
| 3 | 149.429601044 | 26.218366158 | CAFUV | 1.55412431 | 87.540 | |
| 4 | 258.066811386 | 29.923376607 | | 1.00000000 | 84.657 | |
| 5 | −644.172908775 | 42.731138000 | CAFUV | 1.55412431 | 82.829 | |
| 6 | 4374.612901330 | 198.843608746 | | 1.00000000 | 79.636 | |
| 7 | −123.151293249 | 12.000000000 | CAFUV | 1.55412431 | 72.144 | |
| 8 | −486.103678769 | 36.783449945 | | 1.00000000 | 85.904 | |
| 9 | −119.779042846 | 15.000000000 | CAFUV | 1.55412431 | 89.234 | |
| 10 | −177.910079011AS | 1.933693712 | | 1.00000000 | 106.574 | |
| 11 | −179.543989755 | −1.933693712 | | 1.00000000 | 107.751 | REFL |
| 12 | −177.910079011AS | −15.000000000 | CAFUV | 1.55412431 | 106.959 | |
| 13 | −119.779042846 | −36.783449945 | | 1.00000000 | 92.783 | |
| 14 | −486.103678769 | −12.000000000 | CAFUV | 1.55412431 | 92.245 | |
| 15 | −123.151293249 | −198.843608746 | | 1.00000000 | 82.331 | |
| 16 | 4374.612901330 | −42.731138000 | CAFUV | 1.55412431 | 85.343 | |
| 17 | −644.172908775 | −4.139875858 | | 1.00000000 | 86.261 | |
| 18 | −666.363457768 | 4.139875858 | | 1.00000000 | 86.682 | REFL |
| 19 | −644.172908775 | 42.731138000 | CAFUV | 1.55412431 | 88.116 | |
| 20 | 4374.612901330 | 584.263905944 | | 1.00000000 | 102.675 | |
| 21 | −495.625067098AS | −284.703153541 | | 1.00000000 | 372.773 | REFL |
| 22 | −202.781628516AS | 266.762360446 | | 1.00000000 | 111.384 | REFL |
| 23 | −204.670915470AS | 36.220707540 | CAFUV | 1.55412431 | 117.053 | |
| 24 | −184.104640410 | 2.231892279 | | 1.00000000 | 124.249 | |
| 25 | 303.816736042AS | 17.619707154 | CAFUV | 1.55412431 | 120.675 | |
| 26 | 177.463669677 | 18.608778547 | | 1.00000000 | 114.836 | |
| 27 | 209.468539213AS | 97.439314589 | CAFUV | 1.55412431 | 116.751 | |
| 28 | 181.410388840 | 0.950000041 | | 1.00000000 | 110.250 | |
| 29 | 161.869823453AS | 64.710353552 | CAFUV | 1.55412431 | 115.178 | |
| 30 | −976.129830622 | 19.128456290 | | 1.00000000 | 113.915 | |

TABLE 2-continued

| j900 FLAECHE | RADIEN | DICKEN | GLAESER | BRECHZAHL 157.63 nm | ½ FREIER DURCHMESSER |
|---|---|---|---|---|---|
| 31 | −253.852658159AS | 43.025272284 | CAFUV | 1.55412431 | 112.517 |
| 32 | 158.684225172 | 9.847700125 | | 1.00000000 | 105.326 |
| 33 | 174.545959776 | 29.870669039 | CAFUV | 1.55412431 | 110.849 |
| 34 | 440.082909442AS | 20.636013103 | | 1.00000000 | 110.388 |
| 35 | 204.334336799 | 17.595400762 | CAFUV | 1.55412431 | 120.406 |
| 36 | 174.152983444 | 27.633347321 | | 1.00000000 | 117.726 |
| 37 | 304.178032357 | 31.789331929 | CAFUV | 1.55412431 | 120.777 |
| 38 | 9745.067330670AS | 0.950005077 | | 1.00000000 | 121.607 |
| 39 | 1119.767294410 | 26.451281408 | CAFUV | 1.55412431 | 122.352 |
| 40 | −711.473281687 | −14.030853656 | | 1.00000000 | 123.495 |
| 41 | 0.000000000 | 14.980853656 | | 1.00000000 | 122.925 |
| 42 | 300.521153051AS | 38.416698821 | CAFUV | 1.55412431 | 130.602 |
| 43 | −3552.584660330 | 0.950000000 | | 1.00000000 | 130.493 |
| 44 | 220.251399572 | 72.477627664 | CAFUV | 1.55412431 | 128.726 |
| 45 | −394.144465933AS | 10.187867467 | | 1.00000000 | 126.321 |
| 46 | −305.456017514AS | 9.000000000 | CAFUV | 1.55412431 | 122.523 |
| 47 | −401.932510901 | 0.950000000 | | 1.00000000 | 118.819 |
| 48 | 170.697258276AS | 29.530325166 | CAFUV | 1.55412431 | 93.904 |
| 49 | 857.300600992 | 0.950000000 | | 1.00000000 | 88.838 |
| 50 | 137.507824910 | 20.114051970 | CAFUV | 1.55412431 | 73.650 |
| 51 | 219.235388458 | 5.327505147 | | 1.00000000 | 66.630 |
| 52 | 325.168227732AS | 49.881856836 | CAFUV | 1.55412431 | 62.731 |
| 53 | 0.000000000 | 4.053783457 | | 1.00000000 | 30.630 |
| 54 | 0.000000000 | 0.000633368 | | 1.00000000 | 18.250 |

ASPHAERISCHE KONSTANTEN

FLAECHE NR. 2
 $\kappa$  0.0000
 C1  2.46982524e−009
 C2  2.49363651e−013
 C3  −4.61084757e−017
 C4  3.33672481e−021
 C5  −1.46716545e−025

FLAECHE NR. 10
 $\kappa$  0.0000
 C1  2.74929639e−009
 C2  −1.41217725e−014
 C3  2.28110240e−018
 C4  −2.79536651e−022
 C5  −1.37866609e−026

FLAECHE NR. 12
 $\kappa$  0.0000
 C1  2.74929639e−009
 C2  −1.41217725e−014
 C3  2.28110240e−018
 C4  −2.79536651e−022
 C5  −1.37866609e−026

FLAECHE NR. 21
 $\kappa$  0.0000
 C1  3.55152089e−011
 C2  7.96718479e−017
 C3  3.50071406e−022
 C4  −3.95924258e−028
 C5  5.33962387e−033

FLAECHE NR. 22
 $\kappa$  0.0000
 C1  8.60289614e−009
 C2  9.58458194e−014
 C3  7.57581194e−019
 C4  8.21047540e−023
 C5  −3.94855994e−028

FLAECHE NR. 23
 $\kappa$  0.0000
 C1  −1.75722120e−009
 C2  −5.13165618e−013
 C3  9.68091973e−018
 C4  −4.20186305e−022
 C5  −1.00691251e−026

FLAECHE NR. 25
 $\kappa$  0.0000
 C1  −2.51597489e−009
 C2  3.65783517e−013
 C3  −1.98293825e−017
 C4  −9.59525744e−022
 C5  5.32578180e−027
 C6  1.05560488e−030

TABLE 2-continued

| j900 FLAECHE | RADIEN | DICKEN | GLAESER | BRECHZAHL 157.63 nm | ½ FREIER DURCHMESSER |
|---|---|---|---|---|---|
| FLAECHE NR. | 27 | | | | |
| K | 0.0000 | | | | |
| C1 | −1.45052709e−008 | | | | |
| C2 | −7.27238033e−013 | | | | |
| C3 | 9.76342682e−018 | | | | |
| C4 | 8.72564819e−022 | | | | |
| C5 | 1.04624461e−025 | | | | |
| C6 | −5.33911331e−030 | | | | |
| FLAECHE NR. | 29 | | | | |
| K | 0.0000 | | | | |
| C1 | 8.54307742e−009 | | | | |
| C2 | 3.99944583e−013 | | | | |
| C3 | −3.17380442e−017 | | | | |
| C4 | −2.80814434e−021 | | | | |
| C5 | −1.11025751e−025 | | | | |
| C6 | 7.01003457e−030 | | | | |
| FLAECHE NR. | 31 | | | | |
| K | 0.0000 | | | | |
| C1 | 2.04308220e−008 | | | | |
| C2 | 1.51309380e−012 | | | | |
| C3 | −3.85375833e−017 | | | | |
| C4 | 1.08601593e−021 | | | | |
| C5 | −3.41316931e−026 | | | | |
| C6 | −9.13758242e−031 | | | | |
| FLAECHE NR. | 34 | | | | |
| K | 0.0000 | | | | |
| C1 | 2.88421786e−008 | | | | |
| C2 | 1.90717440e−012 | | | | |
| C3 | −4.07197239e−017 | | | | |
| FLAECHE NR. | 38 | | | | |
| K | 0.0000 | | | | |
| C1 | 1.50595743e−008 | | | | |
| C2 | −3.11473860e−013 | | | | |
| C3 | 1.83264934e−017 | | | | |
| C4 | −1.08748000e−021 | | | | |
| C5 | −2.93219695e−026 | | | | |
| FLAECHE NR. | 42 | | | | |
| K | 0.0000 | | | | |
| C1 | −5.04141455e−009 | | | | |
| C2 | −3.38450079e−013 | | | | |
| C3 | 2.59706197e−017 | | | | |
| C4 | −1.57144620e−021 | | | | |
| C5 | 3.14369516e−026 | | | | |
| C6 | −9.58488553e−031 | | | | |
| FLAECHE NR. | 45 | | | | |
| K | 0.0000 | | | | |
| C1 | −1.49597105e−009 | | | | |
| C2 | −1.84975499e−013 | | | | |
| C3 | −1.81850379e−017 | | | | |
| C4 | 1.20052859e−021 | | | | |
| C5 | −5.02425708e−027 | | | | |
| FLAECHE NR. | 46 | | | | |
| K | 0.0000 | | | | |
| C1 | −4.86030815e−009 | | | | |
| C2 | −1.45397783e−012 | | | | |
| C3 | 6.64528344e−017 | | | | |
| C4 | 1.12020072e−021 | | | | |
| C5 | −6.58104526e−026 | | | | |
| C6 | 3.31734509e−031 | | | | |
| FLAECHE NR. | 48 | | | | |
| K | 0.0000 | | | | |
| C1 | −2.13104496e−008 | | | | |
| C2 | −2.27223293e−012 | | | | |
| C3 | 4.14842722e−017 | | | | |
| C4 | −1.38551307e−020 | | | | |
| C5 | −1.54119486e−025 | | | | |
| FLAECHE NR. | 52 | | | | |
| K | 0.0000 | | | | |
| C1 | 1.85001683e−007 | | | | |
| C2 | −1.09120402e−011 | | | | |
| C3 | −8.91959858e−017 | | | | |
| C4 | 9.90546451e−020 | | | | |
| C5 | −9.92519663e−024 | | | | |

What is claimed is:

1. A projection objective comprising at least four curved mirrors, including a first curved mirror that is a most optically forward mirror and a second curved mirror that is a second most optically forward mirror, as defined along a light path, and an intermediate lens element disposed physically between the first and second mirrors, the intermediate lens element being a single pass negative type lens and being arranged optically behind the first curved mirror.

2. The objective of claim 1, wherein a least image forward curved mirror and the first curved mirror are disposed back-to-back relative to one another.

3. The objective of claim 1, wherein at least one curved mirror is an off axis mirror relative to an optical axis.

4. The objective of claim 1, wherein there at least two lens elements disposed between the two most object forward curved mirrors.

5. The objective of claim 4, wherein there are three negative lens elements between the two most object forward curved mirrors.

6. The objective of claim 4, wherein at least two lens elements between the two most object forward curved mirrors are double pass lenses.

7. The objective of claim 1, wherein the second curved mirror has an opening formed therein to accommodate the intermediate lens element.

8. A projection objective comprising at least four curved mirrors, including a first curved mirror that is a most optically forward mirror and is a convex mirror and a second curved mirror that is a second most optically forward mirror, as defined along a light path, and an intermediate lens element disposed physically between the first and second mirrors, the intermediate lens element being a single pass type lens, and
a plurality of lenses optically behind the intermediate lens element wherein lenses that are optically behind the first curved mirror include more positive lenses than negative lenses.

9. The objective of claim 1, wherein the objective forms an image with a numerical aperture selected from the group consisting of at least substantially 0.80 and at least substantially 0.95.

10. The objective of claim 1, including at least one aspherical reflective surface and at least one aspherical refractive surface.

11. A projection objective comprising at least four curved mirrors, including a first curved mirror that is a most optically forward mirror and a second curved mirror that is a second most optically forward mirror, as defined along a light path, and an intermediate lens element disposed physically between the first and second mirrors, the intermediate lens element being a single pass type lens, and
at least one light-dispersing mirror and at least two light-collecting mirrors.

12. The objective of claim 1, including an aperture diaphragm without a plane mirror.

13. The objective of claim 1, including at least one triple pass lens located optically in front of the second curved mirror.

14. The objective of claim 1, including at least two double pass lenses disposed between the two most object forward mirrors and optionally one triple pass lens disposed between the two most object forward mirrors.

15. A projection objective comprising at least four curved mirrors, including a first curved mirror that is a most optically forward mirror and a second curved mirror that is a second most optically forward mirror, as defined along a light path, and an intermediate lens element disposed physically between the first and second mirrors, the intermediate lens element being a single pass type lens, and
an aperture stop located in a refractive group of elements optically behind the last mirror.

16. The objective of claim 1, wherein a pupil of the objective is free of obscuration.

17. The objective of claim 1, wherein there is only one intermediate lens element disposed in an optical path between the first and second mirrors.

18. The objective of claim 1, wherein the objective is free of an intermediate image between the first and second mirrors.

19. A projection exposure apparatus comprising a light source selected from the group of light sources consisting of a DUV and a VUV light source, an illumination system, a reticle handling, positioning and scanning system, a projection objective according to claim 1 and a wafer handling, positioning and scanning system.

20. The objective of claim 8, wherein a least image forward curved mirror and the first curved mirror are disposed back-to-back relative to one another.

21. The objective of claim 8, wherein at least one curved mirror is an off axis mirror relative to an optical axis.

22. The objective of claim 8, wherein there at least two lens elements disposed between the two most object forward curved mirrors.

23. The objective of claim 8, wherein there are three negative lens elements between the two most object forward curved mirrors.

24. The objective of claim 8, wherein at least two lens elements between the two most object forward curved mirrors are double pass lenses.

25. The objective of claim 8, wherein the second curved mirror has an opening formed therein to accommodate the intermediate lens element.

26. The objective of claim 8, wherein the objective forms an image with a numerical aperture selected from the group consisting of at least substantially 0.80 and at least substantially 0.95.

27. The objective of claim 8, including at least one aspherical reflective surface and at least one aspherical refractive surface.

28. The objective of claim 8, including an aperture diaphragm without a plane mirror.

29. The objective of claim 8, including at least one triple pass lens located optically in front of the second curved mirror.

30. The objective of claim 8, including at least two double pass lenses disposed between the two most object forward mirrors and optionally one triple pass lens disposed between the two most object forward mirrors.

31. The objective of claim 11, wherein a least image forward curved mirror and the first curved mirror are disposed back-to-back relative to one another.

32. The objective of claim 11, wherein at least one curved mirror is an off axis mirror relative to an optical axis.

33. The objective of claim 11, wherein there at least two lens elements disposed between the two most object forward curved mirrors.

34. The objective of claim 11, wherein there are three negative lens elements between the two most object forward curved mirrors.

35. The objective of claim 11, wherein at least two lens elements between the two most object forward curved mirrors are double pass lenses.

36. The objective of claim 11, wherein the second curved mirror has an opening formed therein to accommodate the intermediate lens element.

37. The objective of claim 11, wherein the objective forms an image with a numerical aperture selected from the group consisting of at least substantially 0.80 and at least substantially 0.95.

38. The objective of claim 11, including at least one aspherical reflective surface and at least one aspherical refractive surface.

39. The objective of claim 11, including an aperture diaphragm without a plane mirror.

40. The objective of claim 11, including at least one triple pass lens located optically in front of the second curved mirror.

41. The objective of claim 11, including at least two double pass lenses disposed between the two most object forward mirrors and optionally one triple pass lens disposed between the two most object forward mirrors.

42. The objective of claim 15, wherein a least image forward curved mirror and the first curved mirror are disposed back-to-back relative to one another.

43. The objective of claim 15, wherein at least one curved mirror is an off axis mirror relative to an optical axis.

44. The objective of claim 15, wherein there at least two lens elements disposed between the two most object forward curved mirrors.

45. The objective of claim 15, wherein there are three negative lens elements between the two most object forward curved mirrors.

46. The objective of claim 15, wherein at least two lens elements between the two most object forward curved mirrors are double pass lenses.

47. The objective of claim 15, wherein the second curved mirror has an opening formed therein to accommodate the intermediate lens element.

48. The objective of claim 15, wherein the objective forms an image with a numerical aperture selected from the group consisting of at least substantially 0.80 and at least substantially 0.95.

49. The objective of claim 15, including at least one aspherical reflective surface and at least one aspherical refractive surface.

50. The objective of claim 15, including an aperture diaphragm without a plane mirror.

51. The objective of claim 15, including at least one triple pass lens located optically in front of the second curved mirror.

52. The objective of claim 15, including at least two double pass lenses disposed between the two most object forward mirrors and optionally one triple pass lens disposed between the two most object forward mirrors.

* * * * *